United States Patent
Ohkubo

[11] Patent Number: 5,814,843
[45] Date of Patent: Sep. 29, 1998

[54] HETEROJUNCTION BIPOLAR TRANSISTOR HAVING A GRADED-COMPOSITION BASE REGION

[75] Inventor: Michio Ohkubo, Kanagawa, Japan

[73] Assignee: The Furukawa Electric Co., Ltd., Tokyo, Japan

[21] Appl. No.: 566,188

[22] Filed: Dec. 1, 1995

[30] Foreign Application Priority Data

Dec. 1, 1994 [JP] Japan ................................. 6-298422

[51] Int. Cl.$^6$ ...................... H01L 29/737; H01L 29/205
[52] U.S. Cl. ........................... 257/197; 257/198; 257/191
[58] Field of Search ................... 257/191, 197, 257/198

[56] References Cited

U.S. PATENT DOCUMENTS

| | | | |
|---|---|---|---|
| 3,111,611 | 11/1963 | Hunter | 257/191 |
| 3,211,970 | 10/1965 | Christian | 257/191 |
| 4,719,155 | 1/1988 | Matsumoto | 257/191 |
| 5,001,534 | 3/1991 | Lunardi et al. | 257/197 |
| 5,371,389 | 12/1994 | Matsuno et al. | 257/197 |

FOREIGN PATENT DOCUMENTS 04-237135 8/1992 Japan ..................................... 257/197

OTHER PUBLICATIONS

R. H. Saul, "Effect of a GaAs1–xPx Transition Zone on the Perfection of GaP Crystals Grown by Deposition onto GaAs Substrates," Journal of Applied Physics, vol. 40, No. 8, Jul. 1969, pp. 3273–3279.

Sze, S. M. "Semiconductor Devices," 1985 p. 268.

*Primary Examiner*—Jerome Jackson
*Assistant Examiner*—John Guay
*Attorney, Agent, or Firm*—Helfgott & Karas, P.C.

[57] ABSTRACT

A HBT comprises a collector layer, a base layer and an emitter layer overlying a semi-insulating GaAs substrate. The base layer is composed of graded-composition $GaAs_{1-x}P_x$ wherein x is 0 at the interface between the base layer and the collector layer, linearly increases as viewed toward the emitter layer and is 0.15 at the interface between the base layer and the emitter layer. The graded-composition of GaAs base layer provides a high carbon dosage, a high current gain and a high cut-off frequency without rise in the offset voltage.

8 Claims, 1 Drawing Sheet

HETEROJUNCTION BIPOLAR TRANSISTOR HAVING A GRADED-COMPOSITION BASE REGION

BACKGROUND OF THE INVENTION (a). Field of the Invention

The present invention relates to a heterojunction bipolar transistor and, more particularly, to a gallium arsenide (GaAs) based heterojunction bipolar transistor having a base region composed of a gallium arsenide-phosphide (GaAsP) layer.

(b). Description of the Related Art

An aluminium gallium-arsenide/gallium arsenide (AlGaAs/GaAs) heterojunction bipolar transistor (referred to as a HBT hereinafter) can now be expected to be substantiated as a higher performance electron device coming after a high-electron mobility transistor (HEMT). The AlGaAs/GaAs HBT utilizes carbon as a base dopant to reduce base resistance for a high-speed operation. The use of carbon adantageously eliminates a factor deteriorating the device characteristic caused by the diffusion of the base dopant into an emitter layer, which generates undesirable reactive current through recombination of the carriers.

FIG. 1 exemplarily shows the structure of a typical HBT, which is composed of a semi-insulating GaAs substrate 11 and a laminate including an $n^+$-GaAs sub-collector layer 12, an n-GaAs collector layer 13, a p-GaAs base layer 14, an n-AlGaAs emitter layer 15 and an $n^+$-GaAs cap layer 16 consecutively formed on the GaAs substrate 11. The HBT also has a collector electrode 18, a base electrode 19, an emitter electrode 20 for respective layers 12, 14 and 16 and an insulator layer 17 for insulation therebetween.

The HBTs have been developed to reduce in device size thereof for power saving. The reduction in device size, however, revealed that there is another factor in deteriorating the device characteristic other than the factor caused by the diffusion of the base dopant as described above. The second factor is oxidation of the emitter layer 15 during the fabrication process, the emitter layer 15 being composed of AlGaAs and exposed by etching. The oxidation of the emitter layer 15 causes a small amount of leakage current flowing into the base layer 14 through the surface of the emitter layer 15, thereby degrading the device characteristic of the HBT. The smaller the device size becomes, the more the HBT suffers from the leakage current problem. In this respect, a new HBT having an emitter layer composed of InGaP, which does not contain Al, has attracted more interest than the HBT having an AlGaAs emitter layer.

On the other hand, it is also important to increase the current gain and the cut-off frequency in a HBT. In this respect, a base layer having a graded-composition structure is proposed in which composition of the base layer is changed as viewed from the collector side to the emitter side of the base layer. The graded-composition structure provides a graded-bandgap profile in which an effect can be obtained such that an internal electric field is generated within the base layer similarly to the case in which a bias voltage is applied between the emitter layer 15 and the base layer 14. By this structure, the carriers injected into the base layer are accelerated to pass through the base layer, decreasing the recombination rate of the carriers to thereby increase the current gain of the HBT. Further, the carriers also pass through the collector layer in a high-speed to improve the cut-off frequency of the HBT.

If InGaAsP is used for a base layer, the graded-composition structure of InGaAsP in the base layer will provide an excellent lattice matching with GaAs as well as an excellent band gap profile within the base layer. Accordingly, it may be considered that InGaAsP is suitable to a base layer of a graded-composition structure.

However, indium (In), introduced into a GaAs epitaxial layer even in a small amount, prevents carbon in combining with the GaAs epitaxial layer, so that it is not possible to obtain a carbon concentration as high as about $2 \times 10^{19}$ cm$^{-3}$, which is essential in the base layer of the HBT.

To solve the carbon problem as described above, a method may be considered in which the growth temperature for the GaAs epitaxial layer is lowered from the usual growth temperature of about 500° C. to a lower temperature between 50° and 100° C. However, if an InGaAsP layer is grown on a GaAs layer at a low temperature, the InGaAsP layer will have an undesirable immiscible domain in which the composition of the InGaAsP layer is thermodynamically unstable and a variety of compositions thereof co-exist without mixing due to un-uniform epitaxial growth. The lower the growth temperature, the larger the immiscible domain will exist. Accordingly, a uniform epitaxial base layer having a desired composition will not be obtained by this method.

SUMMARY OF THE INVENTION

In view of the foregoing, an object of the present invention is to provide a HBT having a base layer of a graded-composition structure containing substantially no aluminium and doped with carbon at a desired concentration.

According to the present invention, there is provided a HBT comprising a heterojunction bipolar transistor comprising a GaAs substrate and a GaAs collector layer, a base layer and an emitter layer consecutively grown on the GaAs substrate, at least a portion of the base layer being doped with carbon, the base layer being composed of graded-composition compound $GaAs_{1-x}P_x$ wherein x changes as viewed in the direction along the thickness of the base layer.

In accordance with the HBT according to the present invention, the base layer composed of GaAsP can be doped with carbon at a desired concentration independently of the concentration of phosphide. The graded-composition GaAsP base layer can be suitably grown on a GaAs layer. Accordingly, in the present invention, a graded-composition structure of the base layer for a HBT is obtained in which an internal electric field can be generated without applying a bias voltage in the HBT and in which carbon can be doped at a desired concentration in the base layer.

The above and other objects, features and advantages of the present invention will be more apparent from the following description.

DESCRIPTION OF THE PREFERRED EMBODIMENTS

Figure 1:
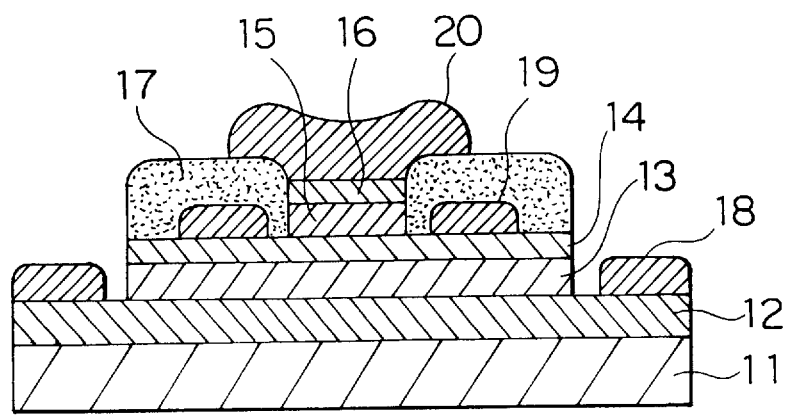
FIG. 1 is a cross-sectional view showing a schematic construction of a typical HBT including a HBT according to the first embodiment of the present invention and a conventional HBT.

Referring back to FIG. 1, there is shown a structure of a HBT implemented by the first embodiment of the present invention.

The HBT according to the present embodiment has a laminate formed on a semi-insulating GaAs substrate 11.

The laminate includes consecutively, as viewed from the GaAs substrate 11, an n+-GaAs sub-collector layer 12 having a thickness of 0.3 μm, an n−-GaAs collector layer 13 having a thickness of 0.3 μm, a carbon doped p-GaAsP base layer 14 having a thickness of 0.05 μm, an n-In$_{0.49}$Ga$_{0.51}$P emitter layer 15 having a thickness of 0.3 μm, and an n+-GaAs cap layer 16 having a thickness of 0.1 μm. The HBT also has a collector electrode 18, a base electrode 19 and an emitter electrode for respective layers 12, 14 and 16 and a insulator layer 17 for insulation therebetween.

The GaAsP base layer 14 is of a graded-composition structure in which the base layer has a graded-composition expressed by GaAs$_{1-x}$P$_x$ wherein value x changes as viewed in the direction along the thickness of the base layer 14. In detail, the value x is 0 at the first interface between the base layer 14 and the collector layer 13, x linearly increases as viewed toward the emitter layer 15 from the first interface, and x is 0.15 at the second interface between the base layer 14 and the emitter layer 15. In other words, the base layer is composed of GaAs adjacent to the first interface for lattice matching with the GaAs collector layer 13 and composed of GaAs$_{0.85}$P$_{0.15}$ adjacent to the second interface substantially without causing misfit dislocations in the InGaP emitter layer 15. The base layer 14 is doped with carbon at a concentration of about $2 \times 10^{19}$ cm$_{-3}$.

A sample of HBT of FIG. 1 according to the embodiment was fabricated, which had the emitter area of $10 \times 3$ μm$^2$. The HBT thus fabricated exhibited a current gain of β=150 at a collector current density Jc=$5 \times 10^4$ A·cm$^{-2}$ and exhibited a cut-off frequency of ft=70 GHz at the collector current density Jc=$5 \times 10^4$ A·cm$^{-2}$.

In the present embodiment, the profile of x for phosphide in the graded-composition of the base layer 14 is not limited to the above embodiment. For example, the profile of x for phosphide in GaAs$_{1-x}$P$_x$ may be such that value x is selected at about 0.05 adjacent to the first interface, increased linearly from the first interface and selected at about 0.20 adjacent to the second interface. The HBT having this profile of x exhibited a current gain of β=150 at Jc=$5 \times 10^4$ A·cm$^{-2}$ and a cut-off frequency as high as ft=110 GHz at Jc=$5 \times 10^4$ A·cm$^{-2}$. Further, the profile of x in the base layer may be arcuate or stepwise as well as linear.

As a first comparative example, a HBT having a base layer 14 composed of GaAs, namely X=0 for GaAs$_{1-x}$P$_x$ in the whole base layer 14, was fabricated. The first comparative example exhibited a lower current gain β=100 at Jc=$5 \times 10^4$ A·cm$^{-2}$ and a lower cut-off frequency ft=50 GHz at Jc=$5 \times 10^4$ A·cm$^{-2}$. As a second comparative example, a HBT having a base layer 14 composed of GaAs$_{0.85}$P$_{0.15}$, namely X=0.15 in GaAs$_{1-x}$P$_x$, was fabricated. The second comparative example exhibited lower characteristics similarly to those of the first comparative example.

Both in the above embodiment and comparative examples, the offset voltage in the current-voltage (I–V) characteristic of the HBT was maintained at 0.03 V. Accordingly, by the present invention, the current gain β and the cut-off frequency ft can be improved substantially without the problem of rise in the offset voltage.

Figure 2:
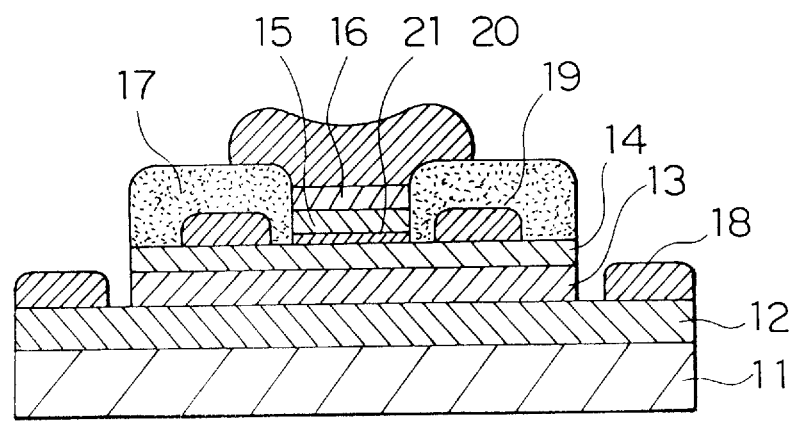
FIG. 2 is a cross-sectional view showing a HBT according to the second embodiment of the present invention.

FIG. 2 shows a HBT according to a second embodiment of the present invention, in which similar elements are designated by the same reference numerals as those in the first embodiment. The construction of the second embodiment is the same as that of the first embodiment except for a GaAs spacer layer 21 interposed between the base layer 14 and the emitter layer 15 in the second embodiment. The GaAs spacer layer 21 has a thickness of a monoatomic layer of GaAs in the embodiment. The spacer layer 21 functions for the prevention of a small degree of misfit dislocations, which might be generated in the emitter layer. The thickness of the spacer layer 21 may be as large as 5 nanometers.

In both the embodiments as described above, the preferable thickness of the base layer 14 is not larger than 120 nanometers for obtaining excellent device characteristics. The emitter layer 15 may be composed of a compound selected from a group consisting of AlGaAs, InGaP and InGaAsP, and the collector layer 13 may be composed a compound selected from a group consisting of GaAs, AlGaAs, InGaP and InGaAsP.

Since above embodiments are described only for examples, the present invention is not limited to such embodiments and it will be obvious for those skilled in the art that various modifications or alterations can be easily made based on the above embodiments within the scope of the present invention.

What is claimed is:

1. A heterojunction bipolar transistor comprising a GaAs substrate and a GaAs collector layer, a base layer and an emitter layer consecutively grown on said GaAs substrate, at least a portion of said base layer being doped with carbon, said base layer being composed of graded-composition compound GaAs$_{1-x}$P$_x$, given X changing as viewed in the direction along the thickness of said base layer, wherein x has a maximum not higher than about 0.20.

2. A heterojunction bipolar transistor as defined in claim 1 wherein x increases as viewed from a first interface between said base layer and said collector layer toward a second interface between said base layer and said emitter layer.

3. A heterojunction bipolar transistor as defined in claim 1 wherein said base layer has a thickness not larger than 120 nanometers.

4. A heterojunction bipolar transistor as defined in claim 1 wherein said emitter layer is composed of a compound selected from a group consisting of AlGaAs, InGaP and InGaAsP.

5. A heterojunction bipolar transistor as defined in claim 1 wherein said collector layer is composed of a compound selected from a group consisting of GaAs, AlGaAs, InGaP and InGaAsP.

6. A heterojunction bipolar transistor comprising a GaAs substrate and a GaAs collector layer, a base layer and an emitter layer consecutively grown on said GaAs substrate, at least a portion of said base layer being doped with carbon, said base layer being composed of graded-composition compound GaAs$_{1-x}$P$_x$, given x changing as viewed in the direction along the thickness of said base layer, wherein said emitter layer is composed of a compound selected from a group consisting of AlGaAs, InGaP and InGaAsP.

7. A heterojunction bipolar transistor comprising a GaAs substrate and a GaAs collector layer, a base layer and an emitter layer consecutively grown on said GaAs substrate, at least a portion of said base layer being doped with carbon, said base layer being composed of graded-composition compound GaAs$_{1-x}$P$_x$, given x changing as viewed in the direction along the thickness of said base layer, wherein x increases as viewed from a first interface between said base layer and said collector layer toward a second interface between said base layer and said emitter layer, wherein said laminate further includes a GaAs spacer layer at said second interface.

8. A heterojunction bipolar transistor as defined in claim 7 wherein said GaAs spacer layer has a thickness between a monoatomic layer thickness and 5 nanometers.

* * * * *